US008908452B2

(12) United States Patent
Cha et al.

(10) Patent No.: US 8,908,452 B2
(45) Date of Patent: Dec. 9, 2014

(54) SEMICONDUCTOR MEMORY APPARATUS

(71) Applicant: SK Hynix Inc., Icheon-si Gyeonggi-do (KR)

(72) Inventors: Jin Youp Cha, Icheon-si (KR); Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/018,868

(22) Filed: Sep. 5, 2013

(65) Prior Publication Data
US 2014/0140151 A1 May 22, 2014

(30) Foreign Application Priority Data

Nov. 20, 2012 (KR) .......................... 10-2012-0131428

(51) Int. Cl.
G11C 7/22 (2006.01)
G11C 7/10 (2006.01)

(52) U.S. Cl.
CPC .............. *G11C 7/1012* (2013.01); *G11C 7/22* (2013.01); *G11C 7/222* (2013.01)
USPC .......... 365/194; 365/219; 365/220; 365/233.1

(58) Field of Classification Search
CPC ........ G11C 7/1012; G11C 7/222; G11C 7/22; G11C 7/1051; G11C 2207/107
USPC ............... 365/194, 185.15, 185.16, 219, 220, 365/233.1
See application file for complete search history.

(56) References Cited

U.S. PATENT DOCUMENTS

| 6,215,726 | B1 * | 4/2001 | Kubo ...................... 365/233.17 |
| 6,552,955 | B1 * | 4/2003 | Miki ......................... 365/233.1 |
| 2001/0007136 | A1 * | 7/2001 | Tamura et al. ................ 713/500 |

FOREIGN PATENT DOCUMENTS

KR 100654125 B1 11/2006
KR 1020110101442 A 9/2011

* cited by examiner

*Primary Examiner* — Tan T. Nguyen
(74) *Attorney, Agent, or Firm* — William Park & Associates Patent Ltd.

(57) ABSTRACT

A semiconductor memory apparatus includes a data alignment control signal generation unit configured to output a data alignment control signal by generating a pulse when a tuning mode signal is enabled, and generate the data alignment control signal as a count pulse is inputted after the data alignment control signal generated by the tuning mode signal is outputted; a timing control block configured to determine a delay amount according to delay codes, generate a delay control signal by delaying the data alignment control signal, and output a timing control signal by latching the delay control signal at an enable timing of a data output control signal; a delay time control block configured to generate the delay codes; and a data alignment unit configured to convert parallel data into serial data, and change a data sequence of the serial data in response to the timing control signal.

20 Claims, 7 Drawing Sheets

SEMICONDUCTOR MEMORY APPARATUS

CROSS-REFERENCES TO RELATED APPLICATION

The present application claims priority under 35 U.S.C. §119(a) to Korean application number 10-2012-0131428, filed on Nov. 20, 2012, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

A semiconductor memory apparatus is configured to store data and output stored data. The semiconductor memory apparatus receives serial type data, converts the serial type data into parallel type data, and stores the converted parallel type data. Also, the semiconductor memory apparatus converts stored parallel type data into serial type data and outputs the converted serial type data. The semiconductor memory apparatus converts parallel type data into serial type data according to an algorithm which converted the serial type data into the parallel type data.

When converting parallel type data into serial type data, a data sequence may be changed according to a specific address.

Referring to FIG. 1, a conventional semiconductor memory apparatus includes a data alignment control signal generation unit 10, a timing control unit 20, a data alignment unit 30, and a data output control signal generation unit 40.

The data alignment control signal generation unit 10 generates a data alignment control signal ctrl_r in response to a read pulse Read_p and a specific address Address.

The timing control unit 20 outputs the data alignment control signal ctrl_r as a timing control signal ctrl_t in response to a data output control signal PINCNT.

The data alignment unit 30 receives parallel data Data_p in response to the data output control signal PINCNT, converts the parallel data Data_p into serial data Data_s and outputs the converted serial data Data_s. When converting the parallel data Data_p into the serial data Data_s in response to the timing control signal ctrl_t, the data alignment unit 30 changes the sequence of the serial data Data_s.

The data output control signal generation unit 40 generates the data output control signal PINCNT in response to the read pulse Read_p.

Referring to FIG. 2, the timing control unit 20 includes a delay section 21 and a latch section 22.

The delay section 21 delays the data alignment control signal ctrl_r and outputs a delay control signal ctrl_d.

The latch section 22 latches the delay control signal ctrl_d in response to the data output control signal PINCNT and outputs the timing control signal ctrl_t.

Since the latch section 22 latches the delay control signal ctrl_d and outputs the timing control signal ctrl_t, if the delay time of the delay section 21 becomes shorter or longer than a preset delay time, the semiconductor memory apparatus is likely to output wrongly sequenced serial data.

SUMMARY

In an embodiment of the present invention, a semiconductor memory apparatus includes: a data alignment control signal generation unit configured to output a data alignment control signal by generating a pulse when a tuning mode signal is enabled, and generate the data alignment control signal as a count pulse is inputted after the data alignment control signal generated by the tuning mode signal is outputted; a timing control block configured to determine a delay amount according to delay codes, generate a delay control signal by delaying the data alignment control signal by the determined delay amount, and output a timing control signal by latching the delay control signal at an enable timing of a data output control signal; a delay time control block configured to generate the delay codes in response to the tuning mode signal, the delay control signal, the data output control signal and the timing control signal; and a data alignment unit configured to convert parallel data into serial data, output the serial data, and change a data sequence of the serial data in response to the timing control signal.

In an embodiment of the present invention, a semiconductor memory apparatus includes: a data alignment control signal generation unit configured to generate a data alignment control signal and a data output control enable signal in response to a tuning mode signal and a count pulse when the tuning mode signal is enabled, generate the data alignment control signal in response to a read pulse and a specific address when the tuning mode signal is disabled, and output the read pulse as the data output control enable signal; a timing control block configured to determine a delay amount in response to delay codes, delay the data alignment control signal by the determined delay amount, latch the delayed signal in response to a data output control signal, and output a latched signal as a timing control signal; a delay time control block configured to compare phases of a delay control signal and the data output control signal when the tuning mode signal is enabled and the timing control signal is disabled, and change a code value of the delay codes; a data output control signal generation unit configured to generate the data output control signal in response to the data output control enable signal; and a data alignment unit configured to convert parallel data into serial data, output the serial data, and change a data sequence of the serial data in response to the timing control signal.

In an embodiment of the present invention, a semiconductor memory apparatus includes: a data alignment control signal generation unit configured for receiving a tuning mode signal, read pulse, specific address, and count pulse, and for generating a data alignment control signal and a data output control enable signal; a timing control block configured for receiving the data alignment control signal, delay codes, a data output control signal and outputting a delay control signal and a timing control signal; a data output control signal generation unit configured for receiving the data output control enable signal and outputting the data output control signal in response to the data output control enable signal; a delay time control block configured for receiving the delay control signal, data output control signal, timing control signal, and tuning mode signal, and configured for outputting the delay codes and the count pulse; and a data alignment unit configured for receiving the timing control signal, parallel data, and the data output control signal, and for outputting serial data.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through various embodiments.

Figure 1:
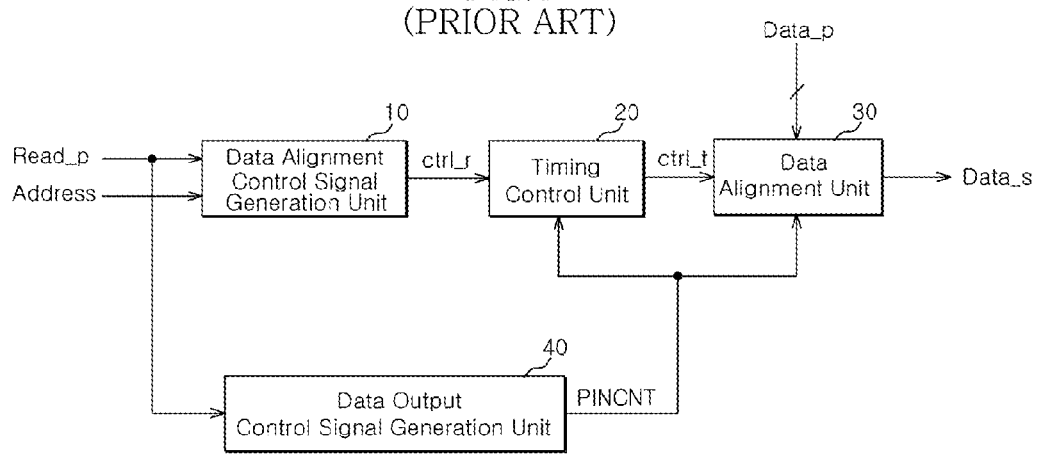
FIG. 1 is a configuration diagram of a conventional semiconductor memory apparatus.
Figure 2:
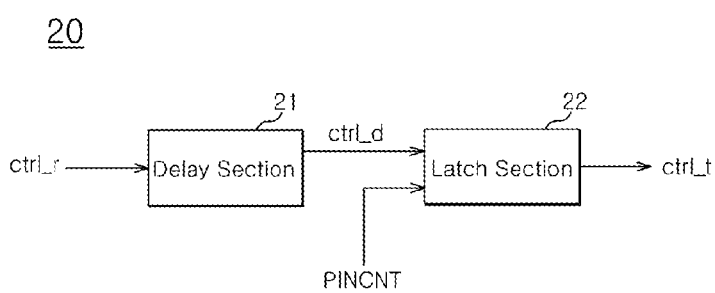
FIG. 2 is a configuration diagram of the timing control unit of FIG. 1.
Figure 3:
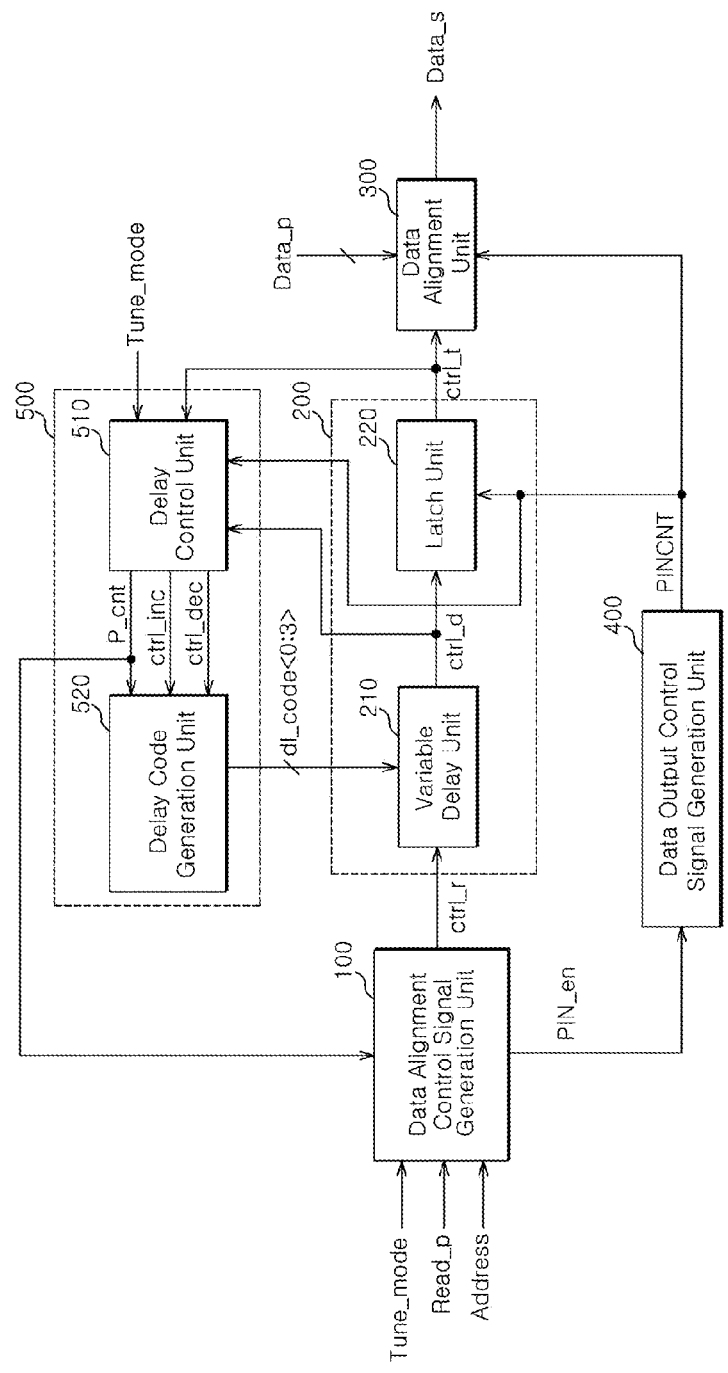
FIG. 3 is a configuration diagram of a semiconductor memory apparatus in accordance with an embodiment of the present invention.

Referring to FIG. 3, a semiconductor memory apparatus in accordance with an embodiment of the present invention may include a data alignment control signal generation unit 100, a timing control block 200, a data alignment unit 300, a data output control signal generation unit 400, and a delay time control block 500.

The data alignment control signal generation unit 100 may be configured to latch a specific address Address in response to a read pulse Read_p not in a tuning mode, that is, in the case where a tuning mode signal Tune_mode is disabled, and output a data alignment control signal ctrl_r. Also, the data alignment control signal generation unit 100 may be configured to generate a pulse at the time when the tuning mode signal Tune_mode is enabled, in the tuning mode, that is, in the case where the tuning mode signal Tune_mode is enabled, and output the data alignment control signal ctrl_r, and thereafter, output a count pulse P_cnt as the data alignment control signal ctrl_r. Additionally, the data alignment control signal generation unit 100 outputs the read pulse Read_p as a data output control enable signal PIN_en in the case where the tuning mode signal Tune_mode is disabled, and outputs the pulse generated by the tuning mode signal Tune_mode and the count pulse P_cnt as the data output control enable signal PIN_en in the case where the tuning mode signal Tune_mode is enabled. The tuning mode signal Tune_mode is a signal which is enabled in an initial operation of the semiconductor memory apparatus, that is, when a power-up signal is enabled, and retains the enabled state for a predetermined time.

The timing control block 200 may be configured to determine a delay time in response to delay codes dl_code<0:3> (i.e., dl_code0, dl_code1, dl_code2, and dl_code3) and delay the data alignment control signal ctrl_r by the determined delay time. Also, the timing control block 200 may be configured to latch the delayed signal in response to a data output control signal PINCNT and output the latched signal as a timing control signal ctrl_t.

The timing control block 200 may include a variable delay unit 210 and a latch unit 220.

The variable delay unit 210 may be configured to determine the delay time in response to the delay codes dl_code<0:3>. Also, the variable delay unit 210 may be configured to delay the data alignment control signal ctrl_r by the determined delay time and output a delay control signal ctrl_d.

The latch unit 220 may be configured to latch the delay control signal ctrl_d in response to the data output control signal PINCNT and output the latched signal as the timing control signal ctrl_t.

The data alignment unit 300 may be configured to receive parallel data Data_p in response to the data output control signal PINCNT, converts the parallel data Data_p into serial data Data_s, and outputs the converted serial data Data_s. When converting the parallel data Data_p into the serial data Data_s in response to the timing control signal ctrl_t, the data alignment unit 300 changes the sequence of the serial data Data_s.

The data output control signal generation unit 400 may be configured to generate the data output control signal PINCNT in response to the data output control enable signal PIN_en.

The delay time control block 500 may be configured to compare the phases of the delay control signal ctrl_d and the data output control signal PINCNT in response to the tuning mode signal Tune_mode and the timing control signal ctrl_t. The delay time control block 500 generates the count pulse P_cnt, a delay amount increase signal ctrl_inc and a delay amount decrease signal ctrl_dec according to a result of comparing the phases of the delay control signal ctrl_d and the data output control signal PINCNT. Also, the delay time control block 500 generates the delay codes dl_code<0:3> in response to the count pulse P_cnt, the delay amount increase signal ctrl_inc and the delay amount decrease signal ctrl_dec.

The delay time control block 500 may include a delay control unit 510 and a delay code generation unit 520.

The delay control unit 510 may be configured to compare the phases of the delay control signal ctrl_d and the data output control signal PINCNT in response to the tuning mode signal Tune_mode and the timing control signal ctrl_t, and output a comparison result as the count pulse P_cnt, the delay amount increase signal ctrl_inc and the delay amount decrease signal ctrl_dec.

The delay code generation unit 520 may be configured to generate the delay codes dl_code<0:3> in response to the count pulse P_cnt, the delay amount increase signal ctrl_inc and the delay amount decrease signal ctrl_dec. For example, the delay code generation unit 520 increases the code value of the delay codes dl_code<0:3> when the delay amount increase signal ctrl_inc is enabled and the count pulse P_cnt is inputted, and decreases the code value of the delay codes dl_code<0:3> when the delay amount decrease signal ctrl_dec is enabled and the count pulse P_cnt is inputted. In detail, assuming that an initial code value of the delay codes dl_code<0:3> is (0, 0, 1, 0), when the delay amount increase signal ctrl_inc is enabled and the count pulse P_cnt is inputted, the code value of the delay codes dl_code<0:3> becomes (0, 1, 0, 0). Assuming that an initial code value of the delay codes dl_code<0:3> is (0, 0, 1, 0), when the delay amount decrease signal ctrl_dec is enabled and the count pulse P_cnt is inputted, the code value of the delay codes dl_code<0:3> becomes (0, 0, 0, 1). After the delay code generation unit 520 generates a code value of the delay codes dl_code<0:3>, the current code value is retained until the code value of the delay codes dl_code<0:3> is changed by the next count pulse P_cnt and the next delay amount increase signal ctrl_inc or the next delay amount decrease signal ctrl_dec.

Figure 4:
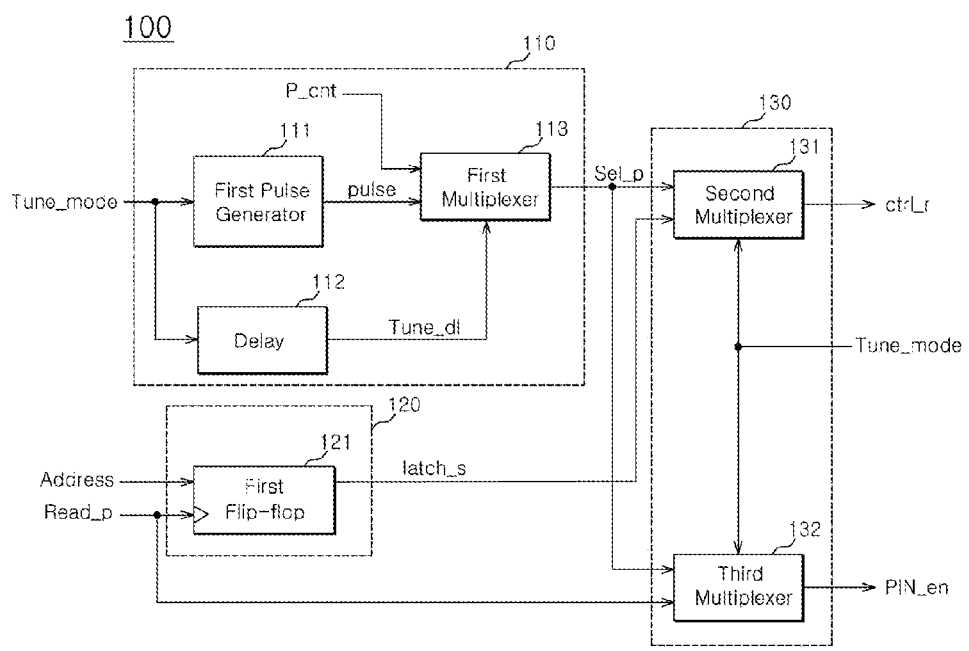
FIG. 4 is a configuration diagram of the data alignment control signal generation unit of FIG. 3.

Referring to FIG. 4, the data alignment control signal generation unit 100 may include a select pulse generating section 110, a latch signal generating section 120, and a signal selecting section 130.

The select pulse generating section 110 may be configured to generate a select pulse Sel_p when the tuning mode signal Tune_mode is enabled and thereafter output the count pulse P_cnt as the select pulse Sel_p.

The select pulse generating section 110 may include a first pulse generator 111, a delay 112, and a first multiplexer 113.

The first pulse generator 111 may be configured to generate a pulse 'pulse' when the tuning mode signal Tune_mode is enabled.

The delay 112 may be configured to delay the tuning mode signal Tune_mode and output a delayed tuning mode signal Tune_dl.

The first multiplexer 113 may be configured to output the pulse 'pulse' or the count pulse P_cnt as the select pulse Sel_p in response to the delayed tuning mode signal Tune_dl. For example, the first multiplexer 113 outputs the pulse 'pulse' as the select pulse Sel_p in the case where the delayed tuning mode signal Tune_dl is disabled, and outputs the count pulse P_cnt as the select pulse Sel_p in the case where the delayed tuning mode signal Tune_dl is enabled. Therefore, the select pulse generating section 110 outputs the pulse 'pulse' generate when the tuning mode signal Tune_mode is enabled, as the select pulse Sel_p, and outputs the count pulse P_cnt as the select pulse Sel_p after the pulse 'pulse' is outputted as the select pulse Sel_p.

The latch signal generating section 120 may include a first flip-flop 121, and may be configured to latch the specific address Address when the read pulse Read_p is inputted, and output a latch signal latch_s.

The signal selecting section 130 may be configured to output the select pulse Sel_p or the latch signal latch_s as the data alignment control signal ctrl_r in response to the tuning mode signal Tune_mode, and output the read pulse Read_p or the select pulse Sel_p as the data output control enable signal PIN_en in response to the tuning mode signal Tune_mode.

The signal selecting section 130 may include second and third multiplexers 131 and 132.

The second multiplexer 131 may be configured to output the select pulse Sel_p as the data alignment control signal ctrl_r when the tuning mode signal Tune_mode is enabled, and output the latch signal latch_s as the data alignment control signal ctrl_r when the tuning mode signal Tune_mode is disabled.

The third multiplexer 132 may be configured to output the select pulse Sel_p as the data output control enable signal PIN_en when the tuning mode signal Tune_mode is enabled, and output the read pulse Read_p as the data output control enable signal PIN_en when the tuning mode signal Tune_mode is disabled.

Figure 5:
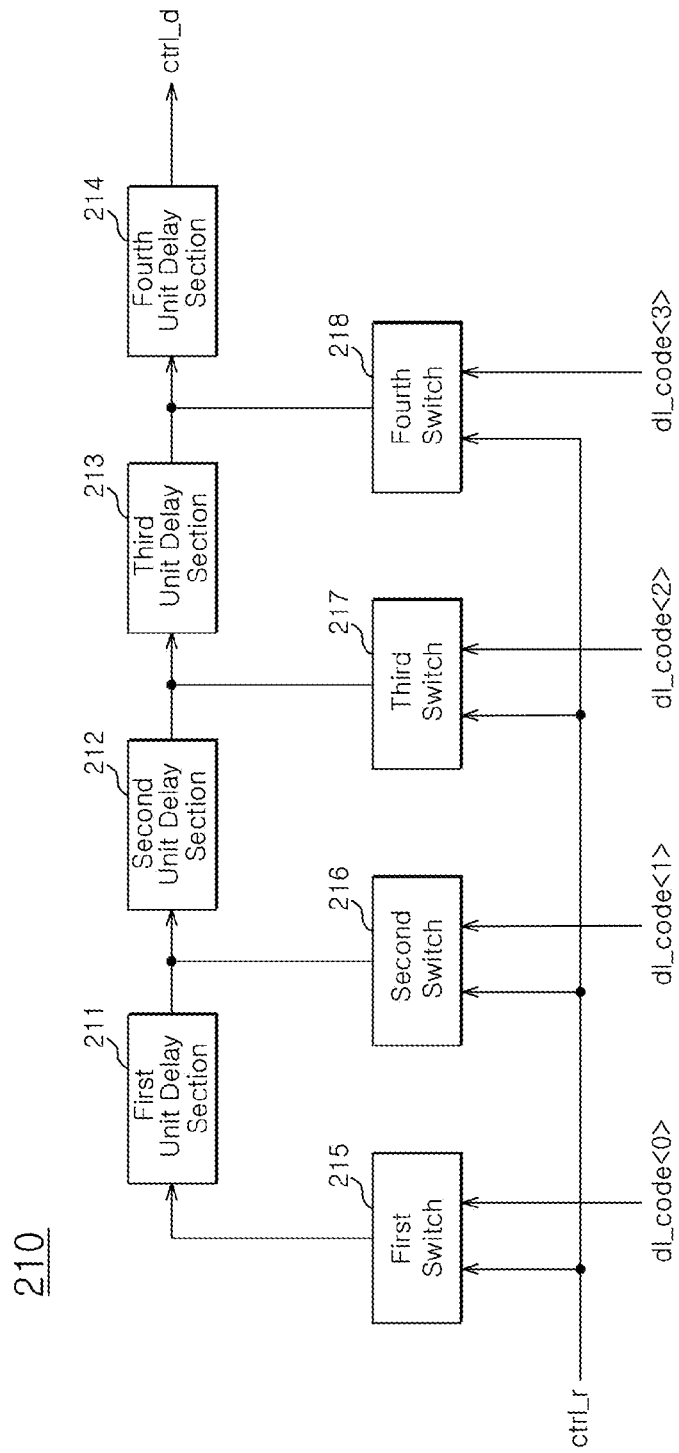
FIG. 5 is a configuration diagram of the variable delay unit of FIG. 3.

Referring to FIG. 5, the variable delay unit 210 may include first to fourth unit delay sections 211 to 214 and first to fourth switches 215 to 218.

The first to fourth unit delay sections 211 to 214 are coupled in series.

The first switch 215 may be configured to output the data alignment control signal ctrl_r to the first unit delay section 211 in response to the first bit dl_code<0> of the delay codes dl_code<0:3>. For example, the first switch 215 is turned on when the value of the first bit dl_code<0> among the delay codes dl_code<0:3> is a high level of '1', and outputs the data alignment control signal ctrl_r to the first unit delay section 211. The first switch 215 is turned off when the value of the first bit dl_code<0> among the delay codes dl_code<0:3> is a low level.

The second switch 216 may be configured to output the data alignment control signal ctrl_r to a node to which the first unit delay section 211 and the second unit delay section 212 are coupled, in response to the second bit dl_code<1> of the delay codes dl_code<0:3>. For example, the second switch 216 is turned on when the value of the second bit dl_code<1> of the delay codes dl_code<0:3> is a high level of '1', and outputs the data alignment control signal ctrl_r to the node to which the first unit delay section 211 and the second unit delay section 212 are coupled. The second switch 216 is turned off when the value of the second bit dl_code<1> among the delay codes dl_code<0:3> is a low level.

The third switch 217 may be configured to output the data alignment control signal ctrl_r to a node to which the second unit delay section 212 and the third unit delay section 213 are coupled, in response to the third bit dl_code<2> of the delay codes dl_code<0:3>. For example, the third switch 217 is turned on when the value of the third bit dl_code<2> of the delay codes dl_code<0:3> is a high level of '1', and outputs the data alignment control signal ctrl_r to the node to which the second unit delay section 212 and the third unit delay section 213 are coupled. The third switch 217 is turned off when the value of the third bit dl_code<2> among the delay codes dl_code<0:3> is a low level.

The fourth switch 218 may be configured to output the data alignment control signal ctrl_r to a node to which the third unit delay section 213 and the fourth unit delay section 214 are coupled, in response to the fourth bit dl_code<3> of the delay codes dl_code<0:3>. For example, the fourth switch 218 is turned on when the value of the fourth bit dl_code<3> of the delay codes dl_code<0:3> is a high level of '1', and outputs the data alignment control signal ctrl_r to the node to which the third unit delay section 213 and the fourth unit delay section 214 are coupled. The fourth switch 218 is turned off when the value of the fourth bit dl_code<3> among the delay codes dl_code<0:3> is a low level.

For example, when the code value of the delay codes dl_code<0:3> is (0, 0, 1, 0), the data alignment control signal ctrl_r is outputted to the node to which the second and third unit delay sections 212 and 213 are coupled, through the third switch 217. That is to say, if the code value of the delay codes dl_code<0:3> is (0, 0, 1, 0), the variable delay unit 210 delays the data alignment control signal ctrl_r through the third and fourth unit delay sections 213 and 214, and outputs the delayed signal as the delay control signal ctrl_d. When the code value of the delay codes dl_code<0:3> is (1, 0, 0, 0), the data alignment control signal ctrl_r is outputted to the first unit delay section 211 through the first switch 215. That is to say, if the code value of the delay codes dl_code<0:3> is (1, 0, 0, 0), the variable delay unit 210 delays the data alignment control signal ctrl_r through the first to fourth unit delay sections 211 to 214, and outputs the delayed signal as the delay control signal ctrl_d.

Figure 6:
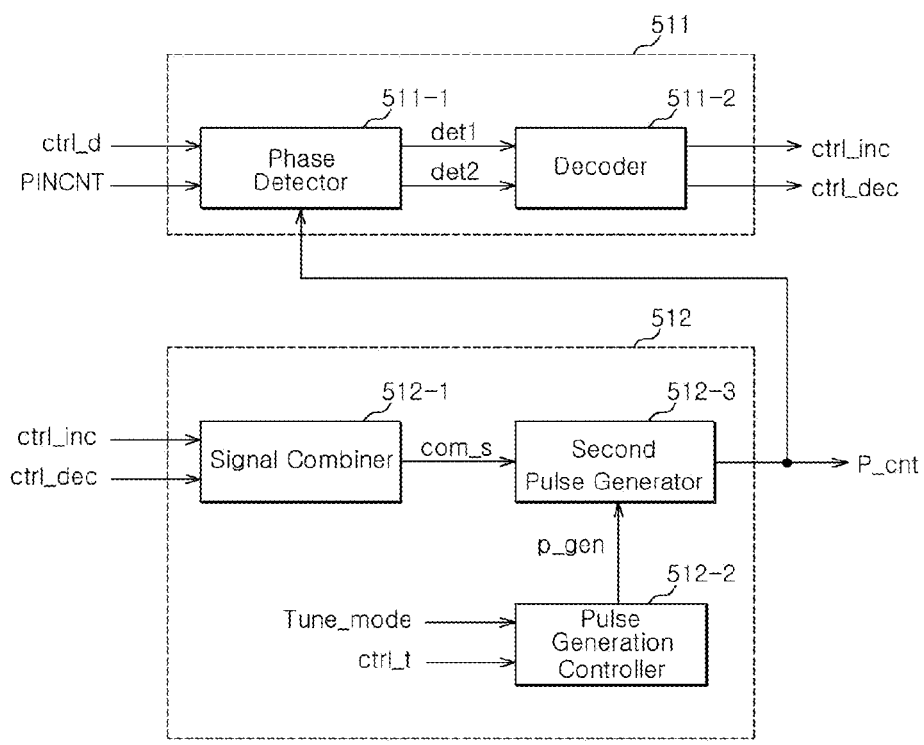
FIG. 6 is a configuration diagram of the delay control unit of FIG. 3.

Referring to FIG. 6, the delay control unit 510 constituting the delay time control block 500 may include a delay amount increase/decrease signal generating section 511, and a count pulse generating section 512.

The delay amount increase/decrease signal generating section 511 may be configured to initialize, that is, disable, both the delay amount increase signal ctrl_inc and the delay amount decrease signal ctrl_dec in the power-up operation of the semiconductor memory apparatus and in the case where the count pulse P_cnt is inputted. Also, the delay amount increase/decrease signal generating section 511 may be configured to compare the phases of the delay control signal ctrl_d and the data output control signal PINCNT and generate the delay amount increase signal ctrl_inc and the delay amount decrease signal ctrl_dec. For example, the delay amount increase/decrease signal generating section 511 enables only the delay amount increase signal ctrl_inc between the delay amount increase signal ctrl_inc and the delay amount decrease signal ctrl_dec in the case where the phase of the delay control signal ctrl_d is earlier than the phase of the data output control signal PINCNT. The delay amount increase/decrease signal generating section 511 enables only the delay amount decrease signal ctrl_dec between the delay amount increase signal ctrl_inc and the delay amount decrease signal ctrl_dec in the case where the phase of the delay control signal ctrl_d is later than the phase of the data output control signal PINCNT.

The delay amount increase/decrease signal generating section 511 may include a phase detector 511-1 and a decoder 511-2.

The phase detector 511-1 may be configured to compare the phases of the delay control signal ctrl_d and the data output control signal PINCNT and generate a first detection signal det1 and a second detection signal det2. The phase detector 511-1 initializes the first and second detection signals det1 and det2 when the count pulse P_cnt is inputted. For example, the phase detector 511-1 initializes the first and second detection signals det1 and det2 into the state in which the first detection signal det1 is enabled and the second detection signal det2 is disabled. The initialization of the phase detector 511-1 is implemented in the power-up operation of the semiconductor memory apparatus and in the case where the count pulse P_cnt is inputted. For example, in the case where the phase of the delay control signal ctrl_d is earlier than the phase of the data output control signal PINCNT, the phase detector 511-1 disables the first detection signal det1 and retains the disabled state of the second detection signal det2. Further, in the case where the phase of the delay control signal ctrl_d is later than the phase of the data output control signal PINCNT, the phase detector 511-1 retains the enabled state of the first detection signal det1 and enables the second detection signal det2.

The decoder 511-2 may be configured to decode the first and second detection signals det1 and det2 and generate the delay amount increase signal ctrl_inc and the delay amount decrease signal ctrl_dec. For example, the decoder 511-2 enables the delay amount increase signal ctrl_inc in the case where both the first and second detection signals det1 and det2 are disabled. The decoder 511-2 enables the delay amount decrease signal ctrl_dec in the case where both the first and second detection signals det1 and det2 are enabled.

The count pulse generating section 512 may be configured to generate the count pulse P_cnt when the delay amount increase signal ctrl_inc or the delay amount decrease signal ctrl_dec is enabled in the case where the tuning mode signal Tune_mode is enabled and the timing control signal ctrl_t is disabled, that is, has a low level.

The count pulse generating section 512 may include a signal combiner 512-1, a pulse generation controller 512-2, and a second pulse generator 512-3.

The signal combiner 512-1 may be configured to enable a combination signal com_s when one of the delay amount increase signal ctrl_inc and the delay amount decrease signal ctrl_dec is enabled.

The pulse generation controller 512-2 may be configured to enable a pulse generation signal p_gen in the case where the tuning mode signal Tune_mode is enabled and the timing control signal ctrl_t is disabled, that is, has the low level.

The second pulse generator 512-3 may be configured to generate the count pulse P_cnt when the combination signal com_s is enabled in the state in which the pulse generation signal p_gen is enabled.

Figure 7:
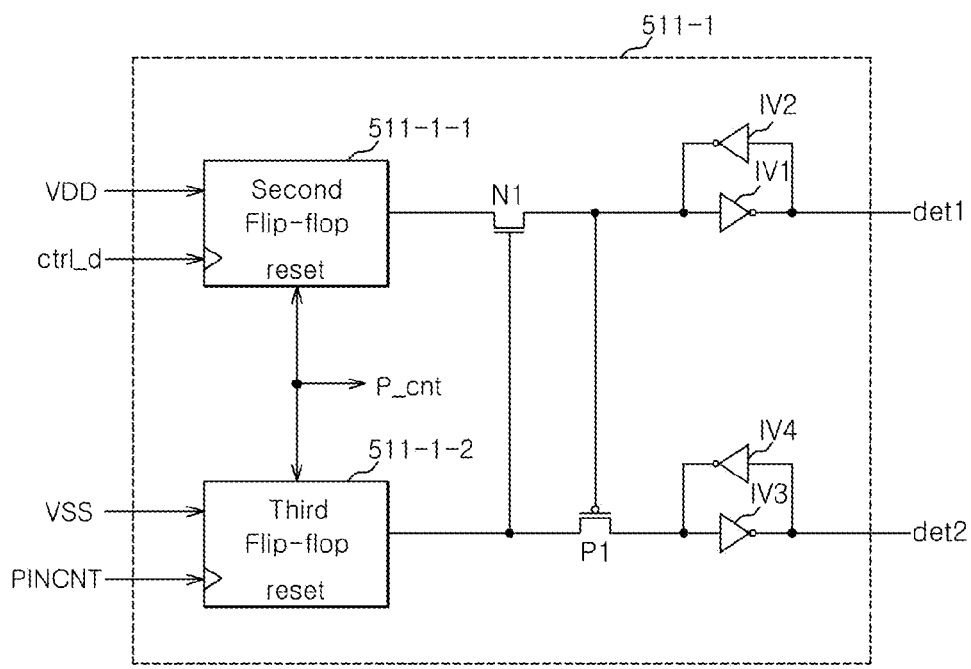
FIG. 7 is a configuration diagram of the increase/decrease signal generating section of FIG. 6.
Figure 7:
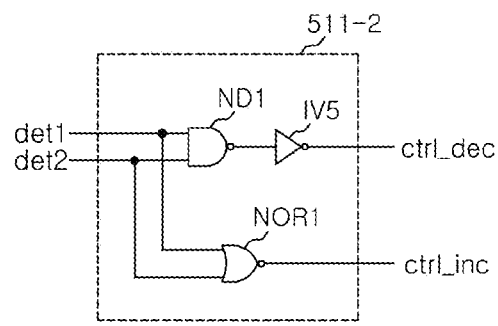

The phase detector 511-1 and the decoder 511-2 of the delay amount increase/decrease signal generating section 511 are configured as shown in FIG. 7.

The phase detector 511-1 may include second and third flip-flops 511-1-1 and 511-1-2, first and second transistors N1 and P1, and first to fourth inverters IV1 to IV4. The second flip-flop 511-1-1 outputs an external voltage VDD as the voltage level of an output signal when the delay control signal ctrl_d is enabled. The third flip-flop 511-1-2 outputs a ground voltage VSS as the voltage level of an output signal when the data output control signal PINCNT is enabled. The second and third flip-flops 511-1-1 and 511-1-2 receive the count pulse P_cnt through the reset terminals thereof, and are initialized when the count pulse P_cnt is inputted. The voltage level of the output signal of the initialized second flip-flop 511-1-1 is the level of the ground voltage VSS, and the voltage level of the output signal of the initialized third flip-flop 511-1-2 is the level of the external voltage VDD. The first transistor N1 has the gate which receives the output signal of the third flip-flop 511-1-2 and the drain which receives the output signal of the second flip-flop 511-1-1. The second transistor P1 has the gate to which the source of the first transistor N1 is coupled and the source which receives the output signal of the third flip-flop 511-1-2. The first inverter IV1 receives the signal which is outputted from the source of the first transistor N1, and outputs the first detection signal det1. The second inverter IV2 receives the output signal of the first inverter IV1 and inputs its output signal to the input terminal of the first inverter IV1. The third inverter IV3 receives the signal which is outputted from the drain of the second transistor P1, and outputs the second detection signal det2. The fourth inverter IV4 receives the output signal of the third inverter IV3 and inputs its output signal to the input terminal of the third inverter IV3.

When initialized, the phase detector 511-1 configured as mentioned above disables the output signal of the second flip-flop 511-1-1 to the low level VSS and enables the output signal of the third flip-flop 511-1-2 to the high level VDD. Since the output signal of the third flip-flop 511-1-2 has the high level, the first transistor N1 is turned on. The first transistor N1 which is turned on transfers the output signal of the second flip-flop 511-1-1 of the low level to the first inverter IV1. The first inverter IV1 which receives the signal of the low level outputs the first detection signal det1 which is enabled to a high level. Also, the output signal of the second flip-flop 511-1-1 which has the low level turns on the second transistor P1 through the first transistor N1 which is turned on. The second transistor P1 which is turned on transfers the output signal of the third flip-flop 511-1-2 of the high level to the third inverter IV3. The third inverter IV3 which receives the signal of the high level outputs the second detection signal det2 which is disabled to a low level. That is to say, the phase detector 511-1 which is initialized enables the first detection signal det1 to the high level and disables the second detection signal det2 to the low level, and retains the values thereof through the second and fourth inverters IV2 and IV4.

If the delay control signal ctrl_d is enabled to a high level earlier than the data output control signal PINCNT, the output signal of the second flip-flop 511-1-1 becomes the high level VDD. If the output signal of the second flip-flop 511-1-1 becomes the high level, the second transistor P1 is turned off. If the second transistor P1 is turned off, the second detection signal det2 retains the state disabled to the low level. Further, if the output signal of the second flip-flop 511-1-1 becomes the high level, the first detection signal det1 is disabled to a low level. In other words, if the delay control signal ctrl_d is enabled earlier than the data output control signal PINCNT, the phase detector 511-1 disables both the first and second detection signals det1 and det2.

Moreover, if the delay control signal ctrl_d is enabled later than the data output control signal PINCNT, that is, if the data output control signal PINCNT is enabled earlier than the delay control signal ctrl_d, the output signal of the third flip-flop 511-1-2 becomes the low level VSS. If the output signal of the third flip-flop 511-1-2 becomes the low level, the first transistor N1 is turned off. If the first transistor N1 is turned off, the first detection signal det1 retains the enabled state. If the output signal of the third flip-flop 511-1-2 becomes the low level, the second detection signal det2 is enabled to a high level. In other words, if the data output control signal PINCNT is enabled earlier than the delay control signal ctrl_d, the phase detector 511-1 enables both the first and second detection signals det1 and det2.

The decoder 511-2 may include a first NAND gate ND1, a first NOR gate NOR1, and a fifth inverter IV5. The first NAND gate ND1 receives the first and second detection signals det1 and det2. The fifth inverter IV5 receives the output signal of the first NAND gate ND1 and outputs the delay amount decrease signal ctrl_dec. The first NOR gate NOR1 receives the first and second detection signals det1 and det2 and outputs the delay amount increase signal ctrl_inc.

The decoder 511-2 enables the delay amount decrease signal ctrl_dec when both the first and second detection signals det1 and det2 are enabled, and enables the delay amount increase signal ctrl_inc when both the first and second detection signals det1 and det2 are disabled.

Figure 8:
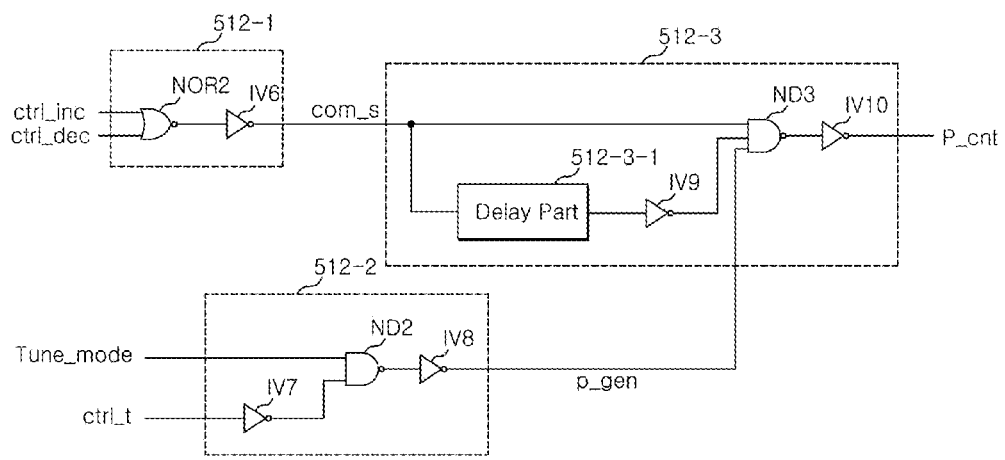
FIG. 8 is a configuration diagram of the count pulse generating section of FIG. 6.

The signal combiner 512-1 (see also FIG. 6), the pulse generation controller 512-2, and the second pulse generator 512-3 of the count pulse generating section 512 are configured as shown in FIG. 8.

The signal combiner 512-1 enables the combination signal com_s if one of the delay amount increase signal ctrl_inc and the delay amount decrease signal ctrl_dec is enabled.

The signal combiner 512-1 may include a second NOR gate NOR2 and a sixth inverter IV6. The second NOR gate NOR2 receives the delay amount increase signal ctrl_inc and the delay amount decrease signal ctrl_dec. The sixth inverter IV6 receives the output signal of the second NOR gate NOR2 and outputs the combination signal com_s.

The pulse generation controller 512-2 generates the pulse generation signal p_gen which is enabled to a high level, in the case where the tuning mode signal Tune_mode is enabled to a high level and the timing control signal ctrl_t is disabled to the low level.

The pulse generation controller 512-2 may include seventh and eighth inverters IV7 and IV8, and a second NAND gate ND2. The seventh inverter IV7 receives the timing control signal ctrl_t. The second NAND gate ND2 receives the output signal of the seventh inverter IV7 and the tuning mode signal Tune_mode. The eighth inverter IV8 receives the output signal of the second NAND gate ND2 and outputs the pulse generation signal p_gen.

The second pulse generator 512-3 generates the count pulse P_cnt which is enabled to a high level when the combination signal com_s is enabled, in the case where the pulse generation signal p_gen is enabled. The second pulse generator 512-3 does not generate the count pulse P_cnt in the case where the pulse generation signal p_gen is disabled.

The second pulse generator 512-3 may include a delay part 512-3-1, ninth and tenth inverters IV9 and IV10, and a third NAND gate ND3. The delay part 512-3-1 delays the combination signal com_s. The ninth inverter IV9 inverts the output signal of the delay part 512-3-1 and outputs a resultant signal. The third NAND gate ND3 receives the combination signal com_s, the output signal of the ninth inverter IV9, and the pulse generation signal p_gen. The tenth inverter IV10 receives the output signal of the third NAND gate ND3 and outputs the count pulse P_cnt.

Operations of the semiconductor memory apparatus in accordance with the embodiments of the present invention, configured as mentioned above, will be described with reference to FIGS. 3 to 8.

The semiconductor memory apparatus in accordance with the embodiments of the present invention may be configured to control the delay time of the variable delay unit 210 of FIG. 3 for the predetermined time in the power-up operation of the semiconductor memory apparatus. The tuning mode signal Tune_mode is a signal which is enabled in the power-up operation of the semiconductor memory apparatus and is disabled after retaining the enabled state for the predetermined time.

Referring to FIG. 4, the data alignment control signal generation unit 100 outputs the pulse 'pulse' enabled to a high level, as the data alignment control signal ctrl_r, when the tuning mode signal Tune_mode is enabled. Also, the data alignment control signal generation unit 100 outputs the count pulse P_cnt as the data alignment control signal ctrl_r after the pulse 'pulse' generated by the tuning mode signal Tune_mode is outputted as the data alignment control signal ctrl_r.

Further, the data alignment control signal generation unit 100 outputs the pulse 'pulse' generated by the tuning mode signal Tune_mode, as the data output control enable signal PIN_en, and thereafter, outputs the count pulse P_cnt as the data output control enable signal PIN_en.

Referring to FIGS. 3 and 5, the variable delay unit 210 determines a delay amount according to the code value of the delay codes dl_code<0:3>, delays the data alignment control signal ctrl_r according to the determined delay amount, and outputs the delay control signal ctrl_d. For example, if the code value of the delay codes dl_code<0:3> is (0, 0, 1, 0), the variable delay unit 210 inputs the data alignment control signal ctrl_r to the third unit delay section 213 through the third switch 217. That is to say, if the code value of the delay codes dl_code<0:3> is (0, 0, 1, 0), the data alignment control signal ctrl_r is delayed through the third unit delay section 213 and the fourth unit delay section 214, and the delayed signal is outputted as the delay control signal ctrl_d.

If the data output control enable signal PIN_en is inputted to the data output control signal generation unit 400, the data output control signal generation unit 400 generates the data output control signal PINCNT.

The latch unit 220 latches the delay control signal ctrl_d at the time when the data output control signal PINCNT is enabled, and outputs the timing control signal ctrl_t.

If the data output control signal PINCNT is enabled in the enable period of the delay control signal ctrl_d as a pulse signal with a high level, the timing control signal ctrl_t becomes a signal with a high level. If the timing control signal ctrl_t has the high level, the delay control unit 510 does not generate the count pulse P_cnt, and the delay code generation unit 520 retains the code value of the delay codes dl_code<0:3>.

If the data output control signal PINCNT is not enabled in the enable period of the delay control signal ctrl_d as the pulse signal with the high level, that is, if the data output control signal PINCNT is enabled in the disable period of the delay control signal ctrl_d, the timing control signal ctrl_t becomes the low level.

If the timing control signal ctrl_t has the low level, the delay control unit 510 compares the phases of the delay control signal ctrl_d and the data output control signal PINCNT, and generates the delay amount increase signal ctrl_inc, the delay amount decrease signal ctrl_dec and the count pulse P_cnt.

Referring to FIGS. 6 to 8, the delay amount increase/decrease signal generating section 511 of the delay control unit 510 enables the delay amount increase signal ctrl_inc in the case where the delay control signal ctrl_d is enabled earlier than the enable timing of the data output control signal PINCNT. The count pulse generating section 512 generates the count pulse P_cnt since the delay amount increase signal ctrl_inc is enabled in the state in which the tuning mode signal Tune_mode is enabled and the timing control signal ctrl_t is disabled to the low level. Further, the delay amount increase/decrease signal generating section 511 of the delay control unit 510 enables the delay amount decrease signal ctrl_dec in the case where the delay control signal ctrl_d is enabled later than the enable timing of the data output control signal PINCNT. The count pulse generating section 512 generates the count pulse P_cnt since the delay amount decrease signal ctrl_dec is enabled in the state in which the tuning mode signal Tune_mode is enabled and the timing control signal ctrl_t is disabled to the low level.

The delay code generation unit 520 changes the code value of the delay codes dl_code<0:3> in response to the delay amount increase signal ctrl_inc, the delay amount decrease signal ctrl_dec and the count pulse P_cnt.

For example, in the case where the code value of the delay codes dl_code<0:3> is (0, 0, 1, 0), if the delay amount increase signal ctrl_inc is enabled and the count pulse P_cnt is inputted, the delay code generation unit 520 generates the delay codes dl_code<0:3> of (0, 1, 0, 0). The delay codes dl_code<0:3> of (0, 1, 0, 0) are inputted to the variable delay unit 210 (see FIG. 5). The delay amount of the variable delay unit 210 is increased in the case where the code value of the delay codes dl_code<0:3> is (0, 1, 0, 0) in comparison with the case where the code value of the delay codes dl_code<0:3> is (0, 0, 1, 0).

Additionally, in the case where the code value of the delay codes dl_code<0:3> is (0, 0, 1, 0), if the delay amount decrease signal ctrl_dec is enabled and the count pulse P_cnt is inputted, the delay code generation unit 520 generates the delay codes dl_code<0:3> of (0, 0, 0, 1). The delay amount of the variable delay unit 210 is decreased in the case where the code value of the delay codes dl_code<0:3> is (0, 0, 0, 1) in comparison with the case where the code value of the delay codes dl_code<0:3> is (0, 0, 1, 0).

The count pulse P_cnt is inputted to the data alignment control signal generation unit 100 and is outputted as the data alignment control signal ctrl_r and the data output control enable signal PIN_en.

The data alignment control signal ctrl_r, which is generated by the count pulse P_cnt, is delayed through the variable delay unit 210 which is changed in the delay amount thereof, and is outputted as the delay control signal ctrl_d.

The data output control enable signal PIN_en, which is generated by the count pulse P_cnt, is inputted to the data output control signal generation unit 400, and is generated as the data output control signal PINCNT.

The latch unit 220 latches the delay control signal ctrl_d at the enable timing of the data output control signal PINCNT, and outputs the latched signal as the timing control signal ctrl_t.

If the timing control signal ctrl_t is at a high level, the count pulse P_cnt is not generated and the code value of the delay codes dl_code<0:3> is retained.

However, if the timing control signal ctrl_t is at a low level, the count pulse P_cnt is generated again, and according to this fact, the operations of changing the code value of the delay codes dl_code<0:3> by comparing the phases of the delay control signal ctrl_d and the data output control signal PINCNT and generating again the data alignment control signal ctrl_r are repeated until the timing control signal ctrl_t becomes the high level.

The timing control signal ctrl_t, which changes the data sequence of the serial data Data_s in the operation of converting the parallel data Data_p into the serial data Data_s, is generated by latching the delay control signal ctrl_d which is generated by delaying the data alignment control signal ctrl_r outputted from the data alignment control signal generation unit 100, at the enable timing of the data output control signal PINCNT.

The semiconductor memory apparatus in accordance with the embodiments of the present invention may be configured such that the operation of latching the pulse enabled to the high level during the tuning mode, that is, while the tuning mode signal Tune_mode is enabled, at the enable timing of the data output control signal PINCNT is repeated, and the delay amount of the signal outputted from the data alignment control signal generation unit 100 is changed when the level of the latched signal is at the low level and is not changed when the level of the latched signal is at the high level.

If the delay amount of the variable delay unit 210 is determined and the tuning mode is exited, that is, the tuning mode signal Tune_mode is disabled, the data alignment control signal generation unit 100 latches the specific address Address at the input timing of the read pulse Read_p and outputs the latched signal as the data alignment control signal ctrl_r. Also, the data alignment control signal generation unit 100 outputs the read pulse Read_p as the data output control enable signal PIN_en. The variable delay unit 210 delays the data alignment control signal ctrl_r by a preset delay amount and outputs the delay control signal ctrl_d. The latch unit 220 latches the delay control signal ctrl_d at the enable timing of the data output control signal PINCNT and generates the timing control signal ctrl_t.

As is apparent from the above descriptions, in the semiconductor memory apparatus in accordance with the embodiments of the present invention, in an operation for converting parallel data into serial data, a signal capable of changing a data sequence of serial data may be normally inputted to a data alignment unit (a component which converts parallel data into serial data). As a consequence, the semiconductor memory apparatus may normally output data, whereby the reliability of the semiconductor memory apparatus may be improved.

While various embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a data alignment control signal generation unit configured to output a data alignment control signal by generating a pulse when a tuning mode signal is enabled, and generate the data alignment control signal according to an input of a count pulse after the data alignment control signal generated by the tuning mode signal is outputted;
   a timing control block configured to determine a delay amount according to delay codes, generate a delay control signal by delaying the data alignment control signal by the determined delay amount, and output a timing control signal by latching the delay control signal at an enable timing of a data output control signal;

a delay time control block configured to generate the delay codes in response to the tuning mode signal, the delay control signal, the data output control signal and the timing control signal; and a data alignment unit configured to convert parallel data into serial data, output the serial data, and change a data sequence of the serial data in response to the timing control signal.

2. The semiconductor memory apparatus according to claim 1, wherein the data alignment control signal generation unit comprises:

a select pulse generating section configured to output a select pulse by generating the pulse when the tuning mode signal is enabled, and output the count pulse as the select pulse after the pulse is outputted as the select pulse;

a latch signal generating section configured to output a latch signal by latching a specific address when a read pulse is enabled; and a signal selecting section configured to output the select pulse as the data alignment control signal or output the latch signal as the data alignment control signal, in response to the tuning mode signal.

3. The semiconductor memory apparatus according to claim 2, wherein the select pulse generating section comprises:

a pulse generator configured to generate the pulse when the tuning mode signal is enabled;

a delay configured to delay the tuning mode signal and generate a delayed tuning mode signal; and a multiplexer configured to output the pulse or the count pulse as the select pulse in response to the delayed tuning mode signal.

4. The semiconductor memory apparatus according to claim 1, wherein the timing control block comprises:

a variable delay unit configured to determine the delay amount in response to the delay codes, delay the data alignment control signal by the determined delay amount, and output the delay control signal; and a latch unit configured to latch the delay control signal at the enable timing of the data output control signal, and output the timing control signal.

5. The semiconductor memory apparatus according to claim 1, wherein the delay time control block comprises:

a delay control unit configured to compare phases of the delay control signal and the data output control signal when the tuning mode signal is enabled and the timing control signal is disabled, and generate the count pulse, a delay amount increase signal and a delay amount decrease signal; and a delay code generation unit configured to generate the delay codes in response to the count pulse, the delay amount increase signal and the delay amount decrease signal.

6. The semiconductor memory apparatus according to claim 5, wherein the delay control unit comprises:

a delay amount increase/decrease signal generating section configured to compare the phases of the delay control signal and the data output control signal, and generate the delay amount increase signal and the delay amount decrease signal; and a count pulse generating section configured to generate the count pulse in response to the delay amount increase signal, the delay amount decrease signal, the tuning mode signal, and the timing control signal.

7. The semiconductor memory apparatus according to claim 6, wherein the delay amount increase/decrease signal generating section enables the delay amount increase signal when the delay control signal is enabled earlier than the data output control signal, and enables the delay amount decrease signal when the delay control signal is enabled later than the data output control signal.

8. The semiconductor memory apparatus according to claim 7, wherein the count pulse generating section generates the count pulse when the delay amount increase signal or the delay amount decrease signal is enabled, in the case where the tuning mode signal is enabled and the timing control signal is disabled.

9. The semiconductor memory apparatus according to claim 5, wherein the delay code generation unit increases a code value of the delay codes when the count pulse is inputted with the delay amount increase signal enabled, and decreases a code value of the delay codes when the count pulse is inputted with the delay amount decrease signal enabled.

10. The semiconductor memory apparatus according to claim 1, wherein the tuning mode signal is a signal which is enabled in a power-up operation of the semiconductor memory apparatus and retains an enabled state for a predetermined time.

11. A semiconductor memory apparatus comprising:

a data alignment control signal generation unit configured to generate a data alignment control signal and a data output control enable signal in response to a tuning mode signal and a count pulse when the tuning mode signal is enabled, generate the data alignment control signal in response to a read pulse and a specific address, and output the read pulse as the data output control enable signal when the tuning mode signal is disabled;

a timing control block configured to determine a delay amount in response to delay codes, delay the data alignment control signal by the determined delay amount, latch the delayed signal in response to a data output control signal, and output a latched signal as a timing control signal;

a delay time control block configured to compare phases of a delay control signal and the data output control signal when the tuning mode signal is enabled and the timing control signal is disabled, and change a code value of the delay codes;

a data output control signal generation unit configured to generate the data output control signal in response to the data output control enable signal; and a data alignment unit configured to convert parallel data into serial data, output the serial data, and change a data sequence of the serial data in response to the timing control signal.

12. The semiconductor memory apparatus according to claim 11, wherein the data alignment control signal generation unit comprises:

a select pulse generating section configured to output a select pulse by generating a pulse when the tuning mode signal is enabled, and output the count pulse as the select pulse after the pulse is outputted as the select pulse;

a latch signal generating section configured to output a latch signal by latching a specific address when the read pulse is enabled; and a signal selecting section configured to output the select pulse as the data alignment control signal and output the select pulse as the data output control enable signal when the tuning mode signal is enabled, and output the latch signal as the data alignment control signal and output the read pulse as the data output control enable signal when the tuning mode signal is disabled.

13. The semiconductor memory apparatus according to claim 11, wherein the timing control block comprises:
   a variable delay unit configured to increase the delay amount when the code value of the delay codes increases, decrease the delay amount when the code value of the delay codes decreases, and generate the delay control signal by delaying the data alignment control signal by the delay amount; and
   a latch unit configured to latch the delay control signal at an enable timing of the data output control signal, and output the timing control signal.

14. The semiconductor memory apparatus according to claim 13, wherein the delay time control block comprises:
   a delay control unit configured to compare the phases of the delay control signal and the data output control signal when the tuning mode signal is enabled and the timing control signal is disabled, and generate the count pulse, a delay amount increase signal and a delay amount decrease signal; and
   a delay code generation unit configured to increase the code value of the delay codes when the delay amount increase signal is enabled and the count pulse is inputted, and decrease the code value of the delay codes when the delay amount decrease signal is enabled and the count pulse is inputted.

15. A semiconductor memory apparatus comprising:
   a data alignment control signal generation unit configured for receiving a tuning mode signal, read pulse, specific address, and count pulse, and for generating a data alignment control signal and a data output control enable signal;
   a timing control block configured for receiving the data alignment control signal, delay codes, a data output control signal and outputting a delay control signal and a timing control signal;
   a data output control signal generation unit configured for receiving the data output control enable signal and outputting the data output control signal in response to the data output control enable signal;
   a delay time control block configured for receiving the delay control signal, data output control signal, timing control signal, and tuning mode signal, and configured for outputting the delay codes and the count pulse; and
   a data alignment unit configured for receiving the timing control signal, parallel data, and the data output control signal, and for outputting serial data.

16. The semiconductor memory apparatus according to claim 15, wherein the data alignment unit converts the parallel data into serial data and changes a data sequence of the serial data in response to the timing control signal.

17. The semiconductor memory apparatus according to claim 15, wherein:
   the data alignment control signal generation unit latches the specific address in response to the read pulse and outputs the data alignment control signal when the tuning mode signal is disabled; and
   the data alignment control signal generation unit outputs the count pulse as the data alignment control signal when the tuning mode signal is enabled.

18. The semiconductor memory apparatus according to claim 15, wherein:
   the data alignment control signal generation unit outputs the read pulse as the data output control enable signal when the tuning mode signal is disabled; and
   the data alignment control signal generation unit outputs the count pulse as the data output control enable signal when the tuning mode signal is enabled.

19. The semiconductor memory apparatus according to claim 15, wherein:
   the timing control block generates the delay control signal by determining a delay time in response to the delay codes and delaying the data alignment control signal by the determined delay time; and
   the timing control block latches the delay control signal in response to the data output control signal and outputs the latched delay control signal as the timing control signal.

20. The semiconductor memory apparatus according to claim 15, wherein:
   the delay time control block compares the phases of the delay control signal and the data output control signal in response to the tuning mode signal and the timing control signal;
   the delay time control block generates the count pulse, a delay amount decrease, and a delay amount increase according to the result of comparison of the phases of the delay control signal and the data output control signal; and
   the delay time control block generates the delay codes in response to the count pulse, the delay amount increase signal and the delay amount decrease signal.

* * * * *